(12) United States Patent
Jeon et al.

(10) Patent No.: US 7,601,647 B2
(45) Date of Patent: Oct. 13, 2009

(54) METHOD OF FORMING FINE PATTERNS OF SEMICONDUCTOR DEVICE USING DOUBLE PATTERNING

(75) Inventors: Kyung-yub Jeon, Gyeonggi-do (KR); Myeong-cheol Kim, Gyeonggi-do (KR); Hak-sun Lee, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 346 days.

(21) Appl. No.: 11/810,200

(22) Filed: Jun. 5, 2007

(65) Prior Publication Data
US 2008/0188083 A1    Aug. 7, 2008

(30) Foreign Application Priority Data
Feb. 6, 2007    (KR)    ............ 10-2007-0012347

(51) Int. Cl.
*H01L 21/302*    (2006.01)
(52) U.S. Cl. ............... 438/717; 257/E21.038
(58) Field of Classification Search ........ 438/401, 438/462, 975, 689, 700, 717; 257/E23.179, 257/E21.035, E21.038, E21.039, E21.232
See application file for complete search history.

(56) References Cited
U.S. PATENT DOCUMENTS
6,723,607 B2 *   4/2004   Nam et al. ............ 438/275

FOREIGN PATENT DOCUMENTS
KR    100165399 B1    9/1998
KR    100257149 B1    2/2000

* cited by examiner

*Primary Examiner*—David Vu
(74) *Attorney, Agent, or Firm*—Myers Bigel Sibley & Sajovec, P.A.

(57) ABSTRACT

A method of forming fine patterns of a semiconductor device includes double etching by changing a quantity of producing polymer by-products to etch a film with different thicknesses in regions having different pattern densities. In a first etching, reactive ion etching (RIE) is performed upon a buffer layer and a hardmask layer both in a low-density pattern region and a high-density pattern region under a first etching ambient until an etch film is exposed in the low-density pattern region using mask patterns as an etch mask. In second etching for forming the hardmask patterns, using the mask patterns as an etch mask, the hardmask layer is etched until the etch film is exposed in the high-density pattern region while accumulating polymer by-products on the etch film in the low-density pattern region under a second etching ambient having polymer by-products produced greater than in the first etching ambient.

20 Claims, 5 Drawing Sheets

METHOD OF FORMING FINE PATTERNS OF SEMICONDUCTOR DEVICE USING DOUBLE PATTERNING

CROSS-REFERENCE TO RELATED PATENT APPLICATION

This application claims the benefit of Korean Patent Application No. 10-2007-0012347, filed on Feb. 6, 2007, in the Korean Intellectual Property Office, the disclosure of which is incorporated herein in its entirety by reference.

FIELD OF THE INVENTION

The present invention relates generally to semiconductor devices, and more particularly to methods of forming semiconductor devices.

BACKGROUND OF THE INVENTION

Fabricating highly integrated semiconductor devices needs highly miniaturized patterns. In order to integrate many elements within a small area, the individual elements must have small dimensions. The small dimensions can be achieved by reducing the pitch of a pattern, which is the sum of the width and the gap between adjacent patterns that are to be formed later. Currently, the drastic decrease of the design rules of semiconductor devices has reached a limit in terms of forming patterns at a fine pitch due to resolution restrictions of photolithography. In particular, if photolithography is used for forming a device isolation region that defines an active region in a substrate or for forming a line and space pattern (hereinafter referred to as "L/S pattern"), the forming of desired patterns at a fine pitch has reached a limit due to the resolution restrictions of photolithography.

In order to overcome the above-stated resolution restrictions of photolithography, methods of forming hardmask patterns at a fine pitch using double patterning have been suggested.

However, when a predetermined pattern is intended to be formed simultaneously in a region having a relatively high pattern density like a cell array region and a region having a relatively low pattern density like a peripheral circuit region or a core region, it is required to develop a double patterning of forming a desired pattern at different pitches for each region so that the double patterning can be selectively applied solely to the region having the higher pattern density.

Particularly, when the patterns at different pitches are simultaneously formed in respective regions having pattern densities different from each other, each region may have a different etch rate per region due to a difference of the pattern densities. Due to the different etch rates per region caused by the difference of the pattern densities, a film thickness that will be removed by subsequent etching may differ according to the pattern densities of respective regions. As a result, desired pattern shapes cannot be obtained due to the difference of the pattern densities in respective regions. Therefore, new double patterning methods, which can solve the problems possibly occurring when a film that is to be removed and has different thicknesses due to the pattern densities, are needed, particularly where predetermined patterns are intended to be simultaneously formed in a plurality of regions.

SUMMARY OF THE INVENTION

The present invention provides a method of forming fine patterns of a semiconductor device that prevents problems occurring due to a thickness difference of a film that is to be removed from each region of a plurality of regions having different pattern densities when patterns of diverse dimensions at various pitches are simultaneously formed on an identical substrate using double patterning for embodying patterns at a fine pitch, which can overcome resolution restrictions of photolithography.

According to an embodiment of the present invention, there is provided a method of forming fine patterns of a semiconductor device comprising: forming a hardmask layer in a first region and a second region of a substrate including an etch film that is to be etched; forming a plurality of mask patterns and buffer layer, wherein the plurality of mask patterns are repeatedly formed by having a first pattern density in the first region and having a second pattern density greater than the first pattern density in the second region, and wherein the buffer layer covers both sidewalls of the mask patterns layer in the second region; first etching by reactive ion etching (RIE) the buffer layer and the hardmask layer both in the first region and the second region under a first etching ambient until a first surface of the etch film is exposed in the first region using the mask patterns as an etch mask; second etching for forming hardmask patterns, under a state that the first surface of the etch film is exposed in the first region and the etch film is not exposed in the second region, by etching the hardmask layer until the second surface of the etch film is exposed in the second region while accumulating polymer by-products on the first surface of the etch film exposed in the first region under a second etching ambient having polymer by-products produced much greater than in the first etching ambient using the mask patterns as an etch mask; removing the polymer by-products accumulated on the first surface in order to expose the first surface of the etch film; and forming etch film patterns by etching the exposed first surface and the second surface of the etch film using the hardmask patterns as an etch mask.

When forming the mask patterns and the buffer layer, the buffer layer covers both sidewalls of the mask patterns with widths of a and b in the second region, and a distance between two adjacent mask patterns from among the mask patterns is greater than 2(a+b) in the first region.

The first etching ambient and the second etching ambient may be composed of identical etchant ingredients each including $O_2$, and a flow rate of $O_2$ in the second etching ambient is less than the flow rate of $O_2$ under the first etching ambient. Otherwise, a temperature of the second etching ambient is lower than a temperature of the first etching ambient.

Dry etching in terms of a plasma method may be used for removing the polymer by-products. Alternatively, an ashing or stripping method may be used for removing the polymer by-products.

The first etching is performed under a state that the hardmask layer is exposed between the mask patterns in the first region and the buffer layer is exposed between the mask patterns in the second region.

The mask patterns comprise first mask patterns formed in the first region and the second region, and second mask patterns formed only in the second region, and the forming of the mask patterns and the buffer layer comprises forming the first mask patterns repeated at a predetermined pitch to have the first pattern density in the first region, and repeated at the first pitch to have a third pattern density twice of the second pattern density in the second region; forming the buffer layer that covers upper surfaces and sidewalls of the first mask patterns and the upper surface of the hardmask layer; and forming the second mask patterns each located between two adjacent first mask patterns from among the first mask patterns on the buffer layer in the second region.

The buffer layer has an upper surface where recesses are each formed between the two adjacent first mask patterns of the from among first mask patterns; and the second mask patterns are formed within the recesses that are formed in the upper surface of the buffer layer.

After forming the second mask patterns, the buffer layer may be partially removed in order to expose the upper surfaces of the first mask patterns.

After forming the plurality of first mask patterns and before forming the buffer layer, the hardmask layer exposed between the plurality of first mask patterns from the upper surface of the hardmask layer may be removed as much as a first thickness in order to form low surface portions on the upper surface of the hardmask layer.

According to the present invention, even if a film to be etched in regions having different pattern densities has different thicknesses, a transfer of steps caused by the thickness difference can be effectively prevented. Consequently, patterns at a fine pitch overcoming resolution restrictions of photolithography can be easily obtained.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF EMBODIMENTS OF THE INVENTION

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to one skilled in the art. In the drawings, the thicknesses of layers and regions are exaggerated for clarity.

The invention will be described more fully hereinafter with reference to the accompanying drawings, in which example embodiments of the invention are shown. This invention may, however, be embodied in many different forms and should not be construed as limited to the example embodiments set forth herein. Rather, the disclosed embodiments are provided so that this disclosure will be thorough and complete, and will fully convey the scope of the invention to those skilled in the art. In the drawings, the size and relative sizes of layers and regions may be exaggerated for clarity. Moreover, each embodiment described and illustrated herein includes its complementary conductivity type embodiment as well. Like numbers refer to like elements throughout.

It will be understood that when an element or layer is referred to as being "on", "connected to" and/or "coupled to" another element or layer, it can be directly on, connected or coupled to the other element or layer or intervening elements or layers may be present. In contrast, when an element is referred to as being "directly on," "directly connected to" and/or "directly coupled to" another element or layer, there are no intervening elements or layers present. As used herein, the term "and/or" may include any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms may be used to distinguish one element, component, region, layer and/or section from another region, layer and/or section. For example, a first element, component, region, layer and/or section discussed below could be termed a second element, component, region, layer and/or section without departing from the teachings of the present invention.

Spatially relative terms, such as "below", "lower", "above", "upper" and the like, may be used herein for ease of description to describe an element and/or a feature's relationship to another element(s) and/or feature(s) as illustrated in the figures. It will be understood that the spatially relative terms are intended to encompass different orientations of the device in use or operation in addition to the orientation depicted in the figures. For example, if the device in the figures is turned over, elements described as "below" other elements or features would then be oriented "above" the other elements or features. Thus, the example term "below" can encompass both an orientation of above and below. The device may be otherwise oriented (rotated 90° or at other orientations) and the spatially relative descriptors used herein interpreted accordingly. Moreover, the term "beneath" indicates a relationship of one layer or region to another layer or region relative to the substrate, as illustrated in the figures.

The terminology used herein is for the purpose of describing particular embodiments only and is not intended to be limiting of the invention. As used herein, the singular terms "a", "an" and "the" are intended to include the plural forms as well, unless the context clearly indicates otherwise. It will be further understood that the terms "comprises," "comprising," "includes" and/or "including" when used in this specification, specify the presence of stated features, integers, steps, operations, elements, and/or components, but do not preclude the presence or addition of one or more other features, integers, steps, operations, elements, components, and/or groups thereof.

Example embodiments of the invention are described herein with reference to plan and cross-section illustrations that are schematic illustrations of idealized embodiments (and intermediate structures) of the invention. As such, variations from the shapes of the illustrations as a result, for example, of manufacturing techniques and/or tolerances, may be expected. Thus, the disclosed example embodiments of the invention should not be construed as limited to the particular shapes of regions illustrated herein unless expressly so defined herein, but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention, unless expressly so defined herein.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

FIGS. 1A through 1K are sectional views illustrating a method of forming fine patterns of a semiconductor device according to an embodiment of the present invention.

Figure 1A:
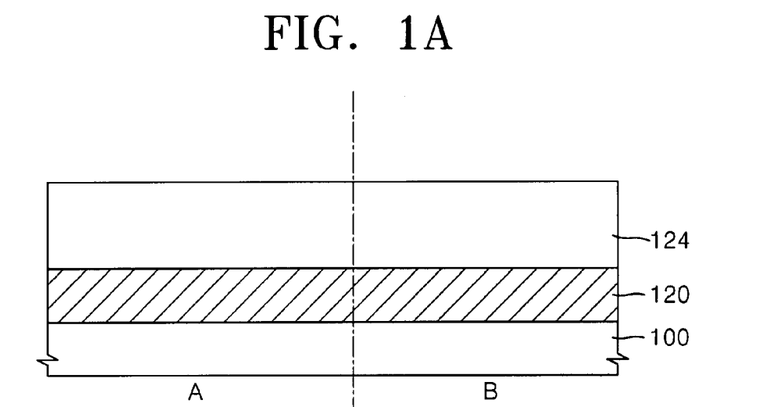
FIGS. 1A through 1K are cross-sectional views illustrating a method of forming fine patterns of a semiconductor device according to an embodiment of the present invention.

Referring to FIG. 1A, an etch film 120, which is to be etched, is formed in both a low-density pattern region A and a high-density pattern region B of a substrate 100. The substrate 100 may be a conventional semiconductor substrate.

The low-density pattern region A of the substrate 100 has a relatively low pattern density per unit area, and may be in a peripheral circuit region or a core region, for example. Otherwise, the low-density pattern region. A may be a portion of the cell array regions, of which desired patterns have a relatively-low-density per unit area. The high-density pattern region B has a pattern density higher than that of the low-density pattern region A per unit area, and may be a portion of the cell array regions, for example.

The etch film 120 may be a conductive layer or an insulating layer for forming a plurality of patterns repeatedly formed at a fine pitch in order to constitute the semiconductor device, which may be composed of a metal, a semiconductor or an insulating material. For example, the etch film 120 may be composed of tungsten (W), tungsten silicide, polysilicon, aluminum (Al) or a combination of these materials. When isolation regions, which are repeatedly formed at a fine pitch, are to be formed in the semiconductor substrate 100, the etch film 120 can be omitted. In the current embodiment, forming of fine patterns from the etch film 120 will be described as an example.

A hardmask layer 124 is formed on the etch film 120. The hardmask layer 124 may be diversely composed of various materials. For example, the hardmask layer 124 may be an oxide film, a nitride film or a combination of these films. Otherwise, if the etch film 120 is an insulating film or a conductive film, the hardmask layer 124 is composed of a material that can provide an etch selectivity according to the material of the etch film 120. For example, the hardmask layer 124 may be an oxide film selected from the group consisting of a thermal oxide film, a chemical vapor deposition (CVD) oxide film, an undoped silicate glass (USG) film and a high-density plasma (HDP) oxide film. Otherwise, the hardmask layer 124 may be a single film selected from the group consisting of SiON, SiN, SiBN and BN. Furthermore, the hardmask layer 124 may be a multiple layer formed of at least one oxide film selected from the oxide films indicated above and at least one nitride film selected from the nitride films indicated above.

Figure 1B:
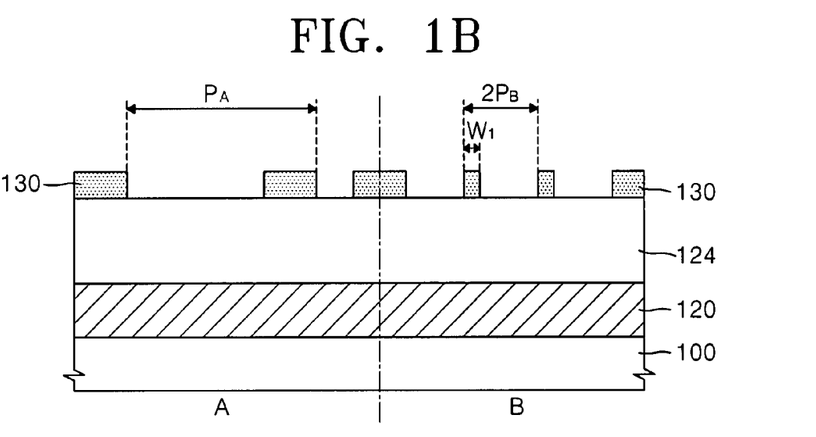

Referring to FIG. 1B, a plurality of first mask patterns 130 are formed on the hardmask layer 124, using conventional photolithography.

The first mask patterns 130 are repeatedly formed at a first pitch $P_A$ that is equal to a pitch $P_A$ of patterns that are to be finally formed on the etch film 120 in the low-density pattern region A of the substrate 100. In the high-density pattern region B of the substrate 100, the first mask patterns 130 are repeatedly formed at a second pitch $2P_B$ that is twice a pitch $P_B$ of patterns that are to be finally formed on the etch film 120.

A first width $W_1$ of the first mask patterns 130 may be ¼ of the second pitch $2P_B$ in the high-density pattern region B. The first mask patterns 130 may be a plurality of line patterns at the second pitch $2P_B$ repeatedly formed in a predetermined direction on the substrate 100, for example.

When the hardmask layer 124 is an oxide film, the first mask patterns 130 may be a polysilicon film or a nitride film including, but not limited to, SiON, SiN, SiBN and BN. Alternatively, when the hardmask layer 124 is a nitride film, the first mask patterns 130 may be, for example, an oxide film.

Figure 1C:
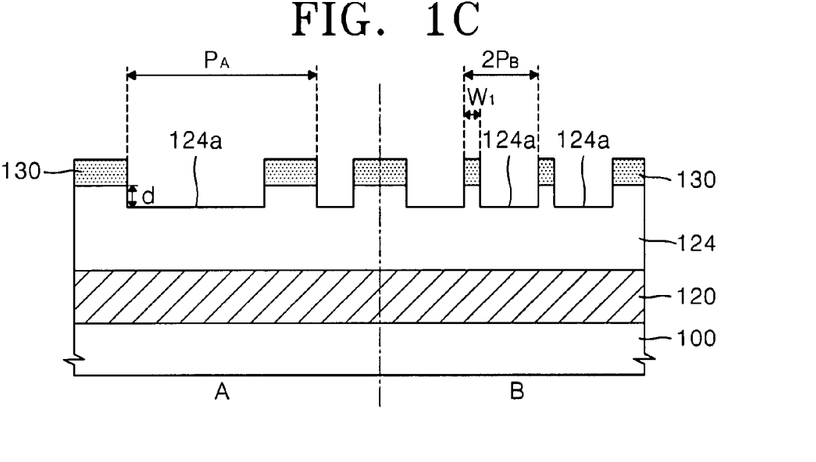

Referring to FIG. 1C, the hardmask layer 124, which is exposed between the first mask patterns 130 in the low-density pattern region A and the high-density pattern region B, is removed as much as a first thickness d from an upper surface of the hardmask layer 124 to form low surface portions 124a.

Furthermore, the first thickness d may be equal to the first width $W_1$ of the first mask patterns 130 that are formed in the high-density pattern region B.

Dry etching may be performed on the upper surface of the hardmask layer 124 in order to form the low surface portions 124a. For example, when forming the first mask patterns 130 described with reference to FIG. 1B, over-etching is performed after the forming of the first mask patterns 130, so that the low surface portions 124a can be formed by dry etching. Alternatively, dry etching for forming the low surface portions 124a may be separately performed.

Figure 1D:
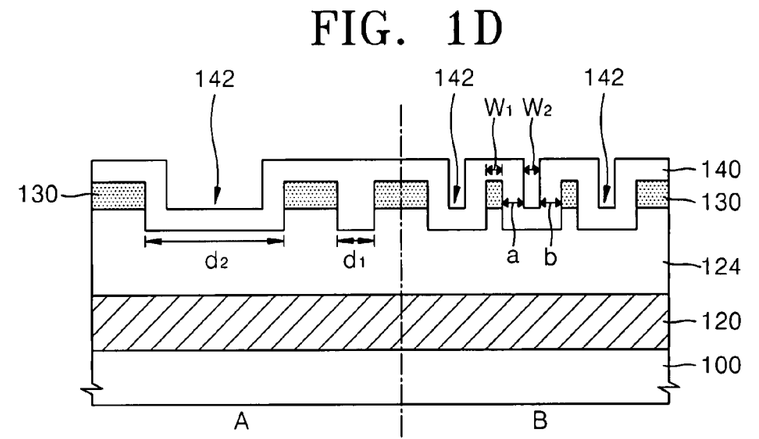

Referring to FIG. 1D, a buffer layer 140 is formed on the first mask patterns 130 and the hardmask layer 124 exposed between the first mask patterns 130.

The buffer layer 140 covers the upper surfaces and sidewalls of the first mask patterns 130 and the low surface portions 124a of the hardmask layer 124 to a uniform thickness. Moreover, the buffer layer 140 may cover the first mask patterns 130 and the low surface portions 124a of the hardmask layer 124 to a thickness equal to the first thickness d. Furthermore, the thickness of the buffer layer 140 may be determined so as to make a second width $W_2$ of recesses 142 equal to the first width $W_1$ of the first mask patterns 130 that are formed in the high-density pattern region B.

In the high-density pattern region B, the buffer layer 140 covers the upper surfaces and the sidewalls of the first mask patterns 130 to a uniform thickness. Moreover, in the high-density pattern region B, the widths a and b of the buffer layer 140 covering the first mask patterns 130 may equal to ¼ of the second pitch $2P_B$, i.e., the first width $W_1$ of the first mask patterns 130. As a result, in the high-density pattern region B, the recesses 142 are formed in the upper portion of the buffer layer 140 between two adjacent first mask patterns 130 from among the first mask patterns 130, as illustrated.

In the low-density pattern region A, if a distance between two adjacent first mask patterns 130 from among the first mask patterns 130 is less than that in the high-density pattern region B, i.e., if a distance $d_1$ between two adjacent first mask patterns 130 is less than a sum of the widths a and b of the buffer layer 140 covering both sidewalls of the first mask pattern 130 in the high-density pattern region B, that is, [$d_1$<a+b], the recess 142 is not formed in the upper surface of the buffer layer 140 within the range of the distance $d_1$, as illustrated in FIG. 1D.

Also, if the distance between two adjacent first mask patterns 130 from among the first mask patterns 130 in the low-density pattern region A is greater than that in the high-density pattern region B, particularly, if a distance $d_2$ between two adjacent first mask patterns 130 is greater than twice the sum of the widths a and b of the buffer layer 140 covering the sidewalls of the first mask patterns 130 in the high-density pattern region B, that is, [$d_2>2(a+b)$], the recesses 142 are formed in the upper surface of the buffer layer 140 within a range of the distance $d_2$, as illustrated in FIG. 1D.

The buffer layer 140 acts as a buffer to make the heights of the first mask patterns 130, which will be used later as an etch mask for patterning the hardmask layer 124, equal to the heights of second mask patterns 150a (see FIG. 1F), which will be formed later within the recesses 142 in a subsequent process.

The buffer layer 140 may be composed of a material having etch characteristics similar to those of the hardmask layer 124. For example, the buffer layer 140 may be composed of a material that constitutes the hardmask layer 124. Otherwise, the buffer layer 140 may be composed of another material with etch characteristics similar to those of the hardmask layer 124. As an example, each of the hardmask layer 124 and the buffer layer 140 may be composed of oxide. Also, the buffer layer 140 may be an oxide film or a nitride film formed by an atomic layer deposition (ALD) method. Alternatively, if the first mask patterns 130 are a polysilicon film, the hardmask layer 124 may be a plasma enhanced oxide (PEOX) film, and the buffer layer 140 may be an oxide film formed by the ALD method.

Figure 1E:
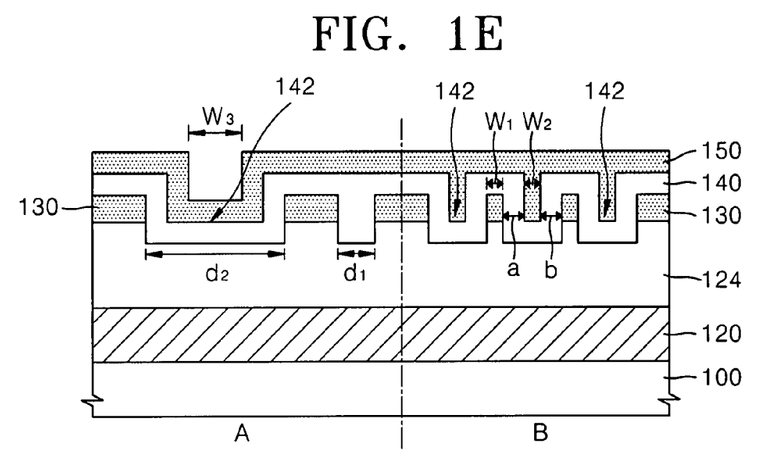

Referring to FIG. 1E, a second mask layer 150 is formed on the buffer layer 140. The second mask layer 150 may be composed of a material with etch characteristics similar to those of the first mask patterns 130. The second mask layer 150 may be composed of a material identical to that constituting the first mask patterns 130, or another material with similar etch characteristics. For example, each of the first mask patterns 130 and the second mask layer 150 may be a polysilicon film. Also, the first mask patterns 130 may be a nitride film and the second mask layer 150 may be a polysilicon film, and vice versa.

In the high-density pattern region B, the recesses 142 formed in the upper surface of the buffer layer 140 are filled with the second mask layer 150. If the widths a and b of the buffer layer 140 covering the sidewalls of the first mask patterns 130 are ¼ of the second pitch $2P_B$, the second width $W_2$ of the second mask layer 150 filled within the recesses 142 in the high-density pattern region B may be ¼ of the second pitch $2P_B$, i.e., equal to the first width $W_1$ of the first mask patterns 130. The second mask layer 150 extends within the recesses 142 in the same direction of the extending direction of the first mask patterns 130.

In the low-density pattern region A, if the distance between two adjacent first mask patterns 130 is small, i.e., if the distance $d_1$ between the first mask patterns 130 is less than the sum of the widths a and b of the buffer layer 140, that is, [$d_1<a+b$], the second mask layer 150 does not extend into the recesses 142 within the distance $d_1$ because no recess is formed in the upper surface of the buffer layer 140 when the widths a and b of the buffer layer 140 covering the sidewalls of the first mask patterns 130 are ¼ of the first pitch $2P_B$, as described above. However, in the low-density pattern region A, if a distance between the two adjacent first mask patterns 130 is greater than that of the high-density pattern region B, and particularly, if the distance $d_2$ between the two adjacent first mask patterns 130 is greater than twice the sum of the widths a and b of the buffer layer 140 covering the sidewalls of the first mask patterns 130, that is, [$d_2>2(a+b)$], the upper surface of the second mask layer 150 is stepped within a region included in the distance $d_2$ after the second mask layer 150 is formed in the recesses 142 portions formed in the upper surface of the buffer layer 140, and the recesses 142 are partially exposed by the steps on the second mask layer 150 by as much as a predetermined width $W_3$, as illustrated in FIG. 1E.

Figure 1F:
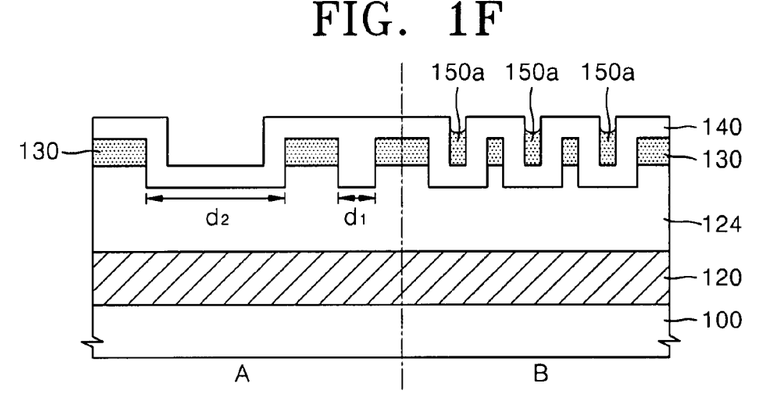

Referring to FIG. 1F, the second mask layer 150 is partially removed in order to form the second mask patterns 150a within the recesses 142 in the high-density pattern region B.

Thus, a plurality of line patterns comprising the second mask patterns 150a, which are identically extending as the first mask patterns 130, are formed within the recesses 142 in the high-density pattern region B. Also, the buffer layer 140, which covers the first mask patterns 130 between the second mask patterns 150a, is exposed. The second mask patterns 150a, which are left within the recesses 142 in the high-density pattern region B, are disposed on approximately the same horizontal plane of the first mask patterns 130, as illustrated in FIG. 1F.

Additionally, in the low-density pattern region A, the second mask layer 150, which is within the recesses 142, is thoroughly removed from a region where the distance $d_2$ between the two adjacent first mask patterns 130 is defined as $d_2>2(a+b)$, and as well as from the second mask layer 150 portion on the upper surface of the buffer layer 140, as illustrated in FIG. 1F. As a result, the buffer layer 140, which covers the first mask patterns 130, is fully exposed in the low-density pattern region A.

When partially removing the second mask layer 150, an etching quantity of the first mask layer 150 can be adjusted in order to make the upper surfaces of the second mask patterns 150a be at the same level as the upper surfaces of the first mask patterns 130 in the high-density pattern region B. In order to partially remove the second mask layer 150, wet etching may be performed, for example.

Figure 1G:
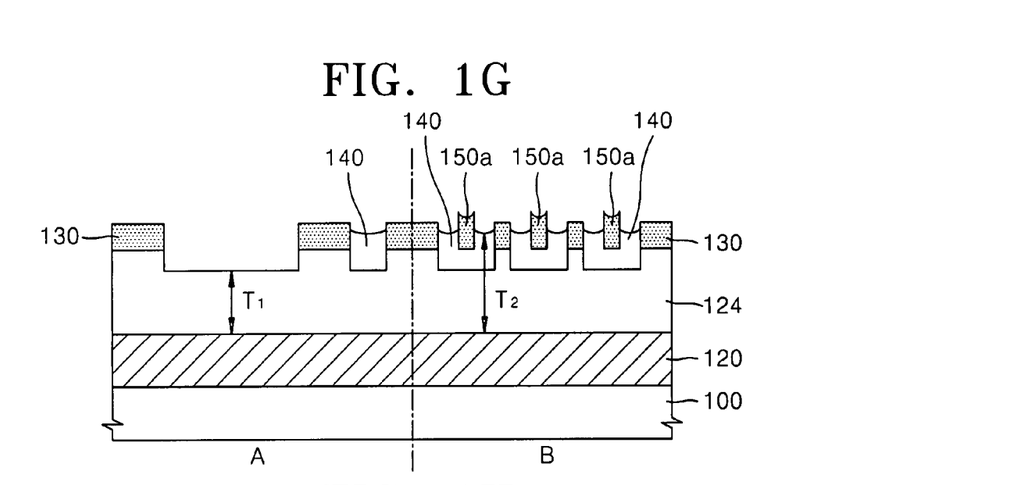

Referring to FIG. 1G, the buffer layer 140 that is exposed, i.e., the portion of the buffer layer 140, which covers the upper surfaces of the first mask patterns 130, is removed in order to expose the upper surfaces of the first mask patterns 130 both in the low-density pattern region A and the high-density pattern region B. Then, the high-density pattern region B has a structure where the upper surfaces of the first mask patterns 130 and the upper surfaces of the second mask patterns 150a are altogether exposed.

In this case, the etching rate of the buffer layer 140 differs in the low-density pattern region A and the high-density pattern region B due to a difference of the mask pattern densities. In other words, while the buffer layer 140 is etched down until the upper surfaces of the first mask patterns 130 in the high-density pattern region B are exposed, almost all of the buffer layer 140 is removed if the distance $d_2$ of the first mask patterns 130 is greater than twice the sum of a and b (i.e., $d_2>2(a+b)$) in the low-density pattern region A, as previously described above. As illustrated in FIG. 1G, the buffer layer 140 may remain between two adjacent first mask patterns 130 until the upper surfaces of the first mask patterns 130 are exposed and the distance $d_1$ between the first mask patterns 130 in the low-density pattern region A is less than the sum of a and be (i.e., [$d_1<a+b$]), which applies similarly to the state of the high-density pattern region B.

Figure 1H:
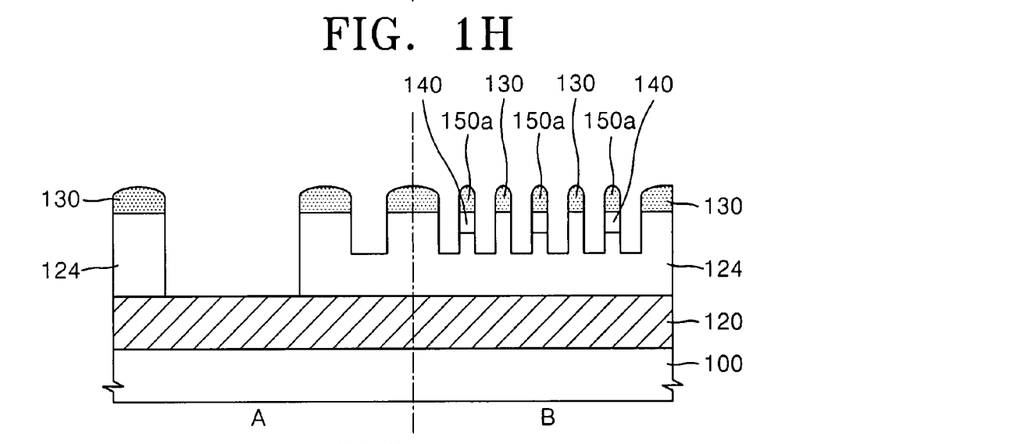
Figure 1I:
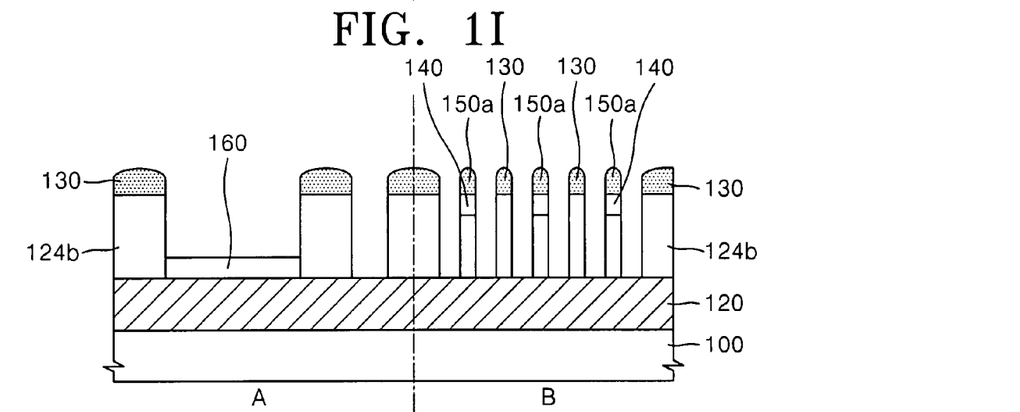

Referring to FIGS. 1H and 1I, using the first mask patterns 130 and the second mask patterns 150a as an etch mask, the buffer layer 140 and the hardmask layer 124 exposed between the first mask patterns 130 and the second mask patterns 150a are etched to expose an upper surface of the etch film 120. For this, first and second etchings are sequentially performed in a different etching ambient from each other.

Hereinafter, the first etching (refer to FIG. 1H) and the second etching (refer to FIG. 1I) of the buffer layer 140 and the hardmask layer 124 until the upper surface of the etch film 120 is exposed will be described in more detail.

By first referring to FIG. 1H, dry etching in terms of reactive ion etching (RIE) is used for the first etching that etches the buffer layer 140 and the hardmask layer 124 exposed between the first mask patterns 130 and the second mask patterns 150a that are used as an etch mask.

When each of the buffer layer 140 and the hardmask layer 124 are composed of an oxide-based material, and the first mask patterns 130 and the second mask patterns 150a are composed of polysilicon, a mixed gas of CxFy (where x and y are integers from 1~10), $O_2$ and Ar may be used as an etchant for the first etching. The CxFy gas may be $C_4F_6$ or $C_4F_8$. In this case, an etching ambient that suppresses production of polymer by-products 160 (FIG. 1I) during etching is achieved until the upper surfaces of the etch film 120 are exposed in the low-density pattern region A. In order to achieve the etching ambient where the production of the polymer by-products 160 is suppressed, a first flow rate ratio of a flow rate of $O_2$ gas to a flow rate of CxFy gas is set such that the first flow rate ratio includes a relatively high flow rate of $O_2$ gas. For example, CxFy, $O_2$ and Ar may be supplied in a flow rate of 30 sccm, 55 sccm and 1000 sccm, respectively during the first etching. In this case, the first flow rate ratio of the flow rate of $O_2$ gas to the first flow rate of CxFy gas (i.e., the flow rate of $O_2$ gas: the flow rate of CxFy gas) is 55:30. The first flow rate ratio of $O_2$ gas to the first flow rate of CxFy gas is given as an example in the current embodiment. The present invention is not limited to this flow rate ratio. The first flow ratio may vary according to the dimensions and densities of the patterns, and a film quality. The first etching may be performed at a room temperature, for example.

In the present embodiment, when etching the buffer layer 140 and the hardmask layer 124, as illustrated in FIG. 1G, a first thickness $T_1$, which corresponds to the thickness of the hardmask layer 124 that has remained, has to be etched in the low-density pattern region A. Also, the second thickness $T_2$, which is a sum of the thicknesses of the hardmask layer 120 and the buffer layer 140 that have remained in the high-density pattern region B, has to be etched in order to expose the etch film 120. Due to the different etch thicknesses in the low-density pattern region A and the high-density pattern region B, the hardmask layer 124 is completely etched to first expose the etch film 120 in the low-density pattern region A while the etching of the hardmask layer 124 has not been completed in the high-density pattern region B during the first etching. Hence, portions of the hardmask layer 124 are not etched, however, remain in the high-density pattern region B until the upper surface of the etch film 120 is exposed by thoroughly removing the hardmask layer 124 in a region where the distance $d_2$ between the first mask patterns 130 is greater than twice the sum of a and b (i.e., $[d_2>2(a+b)]$). If the first etching is continued under this state, the etch film 120 may also be overly etched in the low-density pattern region A. Thus, the difference of the etch thicknesses $T_1$ and $T_2$ may be transferred unchanged in the low-density pattern region A. Therefore, in order to prevent the above-mentioned result, the first etching is finished until the upper surface of the etch film 120 in the low-density pattern region A is exposed, and, particularly, when the upper surface of the etch film 120 is exposed in the region where the distance $d_2$ between the first mask patterns 130 is greater than twice the sum of a and b (i.e., $[d_2>2(a+b)]$).

Subsequently, referring to FIG. 1I, the second etching is performed in-situ with the first etching. When performing the second etching, the residual portions of the remaining portions of the hardmask layer 124 that exist after the first etching between the two adjacent first mask patterns 130 or between the first mask patterns 130 and the second mask patterns 150a are removed, so that the upper surfaces of the etch film 120 are exposed between the first mask patterns 130 and the second mask patterns 150a both in the low-density pattern region A and the high-density pattern region B.

In order to etch the hardmask layer 124 until the upper surface of the etch film 120 is exposed in the low-density pattern region A and the high-density pattern region B, dry etching involving inverse reactive ion etching (iRIE) lag phenomena may be used. Hence, the second etching is carried out under an etching ambient where the polymer by-products 160 that are produced are greater than in the first etching. When second etching involving the iRIE lag phenomena is performed, the polymer by-products 160 accumulate on the exposed upper surface of the etch film 120 in the low-density pattern region A because the polymer by-products 160 can easily accumulate within an opening having a relatively small aspect ratio, i.e., when the distance $d_2$ is greater than twice the sum of a and b. Thus, etching of the etch film 120, which is exposed in the low-density pattern region A, can be prevented due to the polymer by-products 160 that accumulated on the exposed upper surface of the etch film 120 in the low-density pattern region A. While the polymer by-products 160 accumulated on the etch film 120 that is exposed in the low-density pattern region A, the hardmask layer 124 exposed between the first mask patterns 130 and the second mask patterns 150a is etched in the high-density pattern region B, and thereby, forming hardmask patterns 124b that expose the upper surfaces of the etch film 120. As the result, the upper surface of the etch film 120 is exposed between the first mask patterns 130 and the second mask patterns 150a in the high-density pattern region B. When etching is performed until the etch film 120 is exposed, the first mask patterns 130 and the second mask patterns 150a, which are used as the etch mask, may be partially or entirely consumed as illustrated in FIG. 1I.

If the hardmask layer 124 is composed of an oxide-based material and the first mask patterns 130 and the second mask patterns 150a are each composed of polysilicon, a mixed gas of CxFy (where x and y are integers from 1~10), $O_2$ and Ar may be used as an etchant for second etching. The CxFy gas may be $C_4F_6$ or $C_4F_8$, for example. In this case, in order to carry out the second etching in an etching ambient where the polymer by-products 160 are produced greater than in the first etching, the etchant having the same composition as in the first etching may be used, however, the $O_2$ gas content of the etchant may be decreased. In other words, the etching ambient of the second etching is set with a second flow rate ratio in which the flow rate of $O_2$ gas is lower than that for the first etching. For example, in the second etching, CxFy, $O_2$ and Ar may be supplied in a flow rate of 30 sccm, 35 sccm and 1000 sccm, respectively. In this case, the second flow rate ratio of the flow rate of $O_2$ gas to the flow rate of CxFy gas (i.e., the flow rate of $O_2$ gas:the flow rate of CxFy gas) is 35:30. However, the second flow rate ratio described in the current embodiment is not limited to this ratio. The second flow rate ratio may be changed according to dimensions and densities of the patterns, a film quality, etc.

Otherwise, when the second etching involving the iRIE lag phenomena is performed such that the second etching with the greater polymer by-products 160 than that of the first etching is performed, the composition and the flow rate ratio of the etchant for second etching are identically set to those for first etching, however, an etching temperature may be about −5° C., which is lower than that of the first etching. Moreover, for second etching, it is possible that the second flow rate ratio of the flow rate of $O_2$ gas to the flow rate of CxFy gas is set to be lower than that of the first etching, and, simultaneously, the etching temperature that is applied during the second etching is lower than that of the first etching.

Figure 1J:
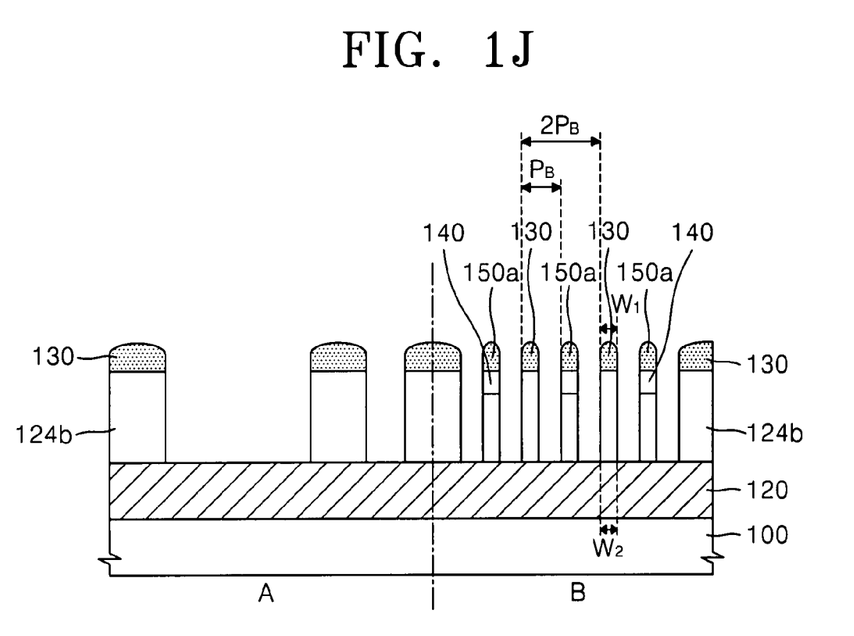

Referring to FIG. 1J, the polymer by-products 160 that accumulated in the low-density pattern region A are removed.

In order to remove the polymer by-products 160 that accumulated in the low-density pattern region A, dry etching in terms of a plasma method using a mixed gas of at least one gas selected from the group consisting of $CHF_3$ and $CH_2F_2$, $O_2$ and Ar may be used. Alternatively, in order to remove the polymer by-products 160 that accumulated in the low-density pattern region A, conventional ashing and stripping methods may be used.

By doing so, the hardmask patterns 124b that expose the upper surface of the etch film 120 are obtained in the low-density pattern region A and the high-density pattern region B. In this case, the hardmask patterns 124b have the width $W_2$ that is ¼ of the second pitch $2P_B$, i.e., approximately equal to the first width $W_1$ of the first mask patterns 130, in the high-density pattern region B, as illustrated. Also, in the high-density pattern region B, the hardmask patterns 124b have the line and space patterns at the first pitch $P_B$ that is half of the second pitch $2P_B$ on the substrate 100 by the first mask patterns 130 and the second mask patterns 150a. Furthermore, the hardmask patterns 124b have a pattern structure repeatedly formed at the first pitch $P_A$ equal to the pitch $P_A$ of the first mask patterns 130 as described with reference to FIG. 1B, i.e., the first pitch $P_A$ of the patterns that are desired to be finally formed on the etch film 120, in the low-density pattern region A.

Figure 1K:
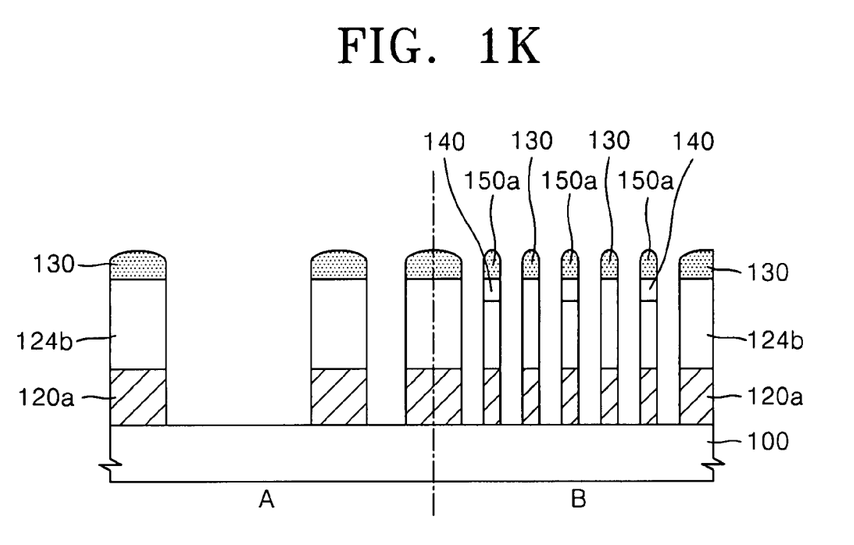

Referring to FIG. 1K, using the hardmask patterns 124b, and the first mask patterns 130 and the second mask patterns 150a remaining on the hardmask patterns 124b as an etch mask, the etch film 120 is anisotropically dry etched to form fine patterns 120a.

In the low-density pattern region A, the fine patterns 120a pattern transfer to the etch film 120 are simply accomplished by the first mask patterns 130. However, in the high-density pattern region B, the fine patterns 120a pattern transfer to the etch film 120 are accomplished by the first mask patterns 130 and the second mask patterns 150a. Therefore, patterns at a fine pitch that overcome resolution restrictions of photolithography can be easily embodied in the high-density pattern region B.

Also, regardless of the thickness difference of the etch film 120 that is to be etched in the low-density pattern region A and the high-density pattern region B, as described with reference to FIGS. 1H and 1I, the hardmask layer 124 and the buffer layer 140, for patterning the hardmask layer 124, are etched by double etching using RIE and iRIE lag effects, and thereby, preventing the problems of differences of a pattern profile according to the pattern densities in the etch film patterns 120a obtained after patterning the etch film 120.

Figure 2:
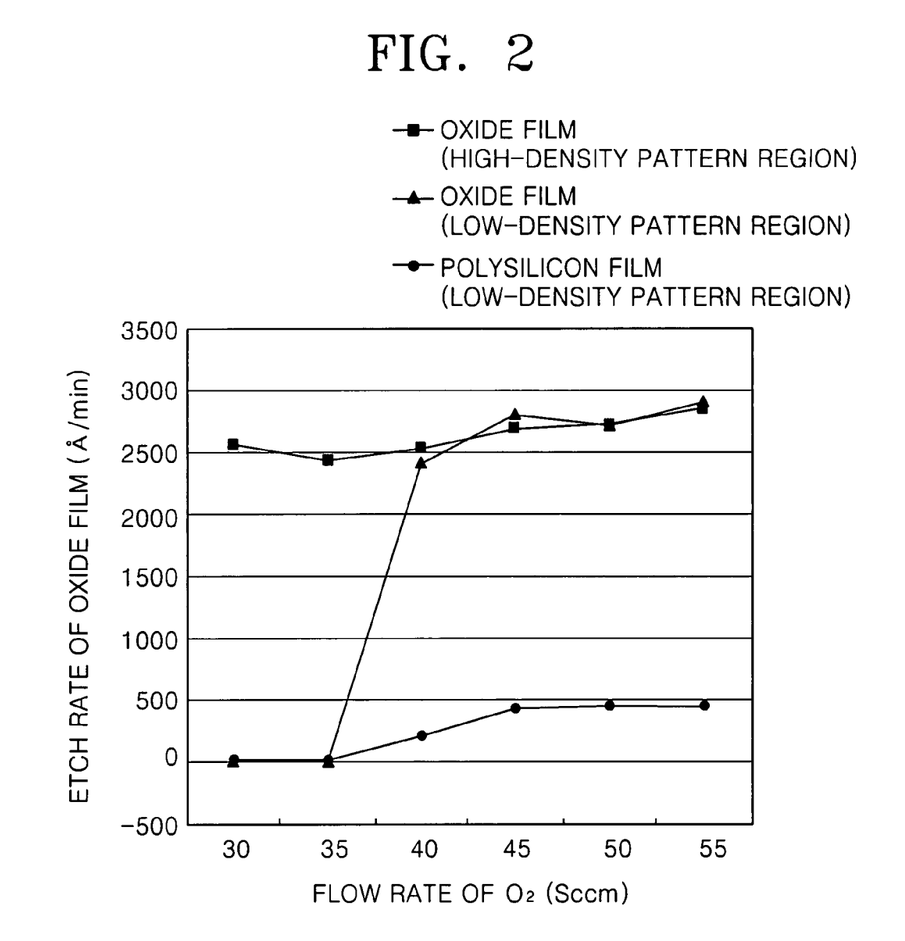
FIG. 2 is a graph illustrating a result of measuring an etching quantity of an oxide film according to a flow rate of $O_2$ of an etchant used for double etching when patterning a hardmask layer in a method of forming fine patterns of a semiconductor device according to the present invention.

FIG. 2 is a graph illustrating a result of measuring an etching quantity of an oxide film according to the flow rate of $O_2$ of the etchant used for double etching using RIE process and iRIE lag process when patterning the hard mask layer 124 described with reference to FIGS. 1H and 1I.

To obtain the results of FIG. 2, the etching rate of an oxide film in view of the flow rate of $O_2$ was measured when the oxide film filled between a plurality of polysilicon film patterns is etched in a low-density pattern region having polysilicon film patterns at a pitch of 65 nm and with a width of 40 nm and in a high-density pattern region having the polysilicon film patterns at a pitch of 1 μm and with a width of 120 nm, using the polysilicon film patterns as an etch mask under an ambient that is set such that a source power Ws in an etching facility of RIE was 1200 W, a bias power Wb was 3500 W, the pressure was 20 mT and a temperature was 20° C. The oxide film is formed by an ALD method. According to the results, a mixed gas of $C_4F_6$ supplied at a flow rate of 30 sccm, Ar supplied at a flow rate of 1000 sccm and $O_2$ supplied at diverse flow rates as plotted in FIG. 2 was used as the etchant of the oxide film.

From the result of FIG. 2, both the etch rates of the oxide film were relatively high both in the low-density pattern region A and the high-density region B when the flow rate of $O_2$ was about 40 sccm or greater. When the flow rate of $O_2$ was about 40 sccm or less, the etch rate of the oxide film was relatively high in the high-density pattern region B; however, the oxide film was never etched in the low-density pattern region A. In other words, when the flow rate of $O_2$ was about 40 sccm or more, the quantity of the polymer by-products produced under the etching ambient was low in order to etch the oxide film both in the low-density pattern region A and the high-density pattern region B. Whereas, if the flow rate of $O_2$ was about 40 sccm or less, the quantity of producing the polymer by-products 160 increased in order for polymer by-products 160 to easily accumulate in the low-density pattern region A, and thus, the oxide film was not etched.

A method of forming fine patterns of a semiconductor device according to the present invention uses double etching by varying a quantity of produced polymer by-products in order to etch a film having a thickness differing in accordance with pattern densities in case that the thickness that are to be etched in different regions that have the different pattern densities are different from each other when forming patterns with diverse dimensions at different pitches on a substrate using double patterning. In the double etching that is performed for forming the fine patterns according to the present invention, a first etching involving RIE effects is performed both in a low-density pattern region and a high-density pattern region until an etch film, which is to be etched, is exposed by inhibiting the production of polymer by-products. Then, a second etching involving iRIE lag effects is performed by changing the etching ambient in order to produce a lot of polymer by-products until the surface of the etch film in the low-density pattern region is exposed, and thus, the polymer by-products accumulate on the exposed etch film in the low-density pattern region, and a hardmask layer is etched in the high-density pattern region.

Therefore, in the method of forming the fine patterns of the semiconductor device according to the present invention, even if a film, which is to be etched in regions having different pattern densities, has different thicknesses, a transfer of steps caused by the thickness difference can be effectively prevented. Consequently, patterns at a fine pitch that overcome resolution restrictions of photolithography can be easily embodied.

While the present invention has been particularly shown and described with reference to exemplary embodiments thereof, it will be understood by one of ordinary skill in the art that various changes in form and details may be made therein without departing from the spirit and scope of the present invention as defined by the following claims.

What is claimed is:

1. A method of forming fine patterns of a semiconductor device comprising:

forming a hardmask layer in a first region and a second region of a substrate including an etch film that is to be etched;

forming a plurality of mask patterns and buffer layer on the hardmask layer, wherein the plurality of mask patterns are repeatedly formed by having a first pattern density in the first region and having a second pattern density greater than the first pattern density in the second region, and wherein the buffer layer covers both sidewalls of the mask patterns in the second region;

first etching by reactive ion etching (RIE) the buffer layer and the hardmask layer both in the first region and the second region under a first etching ambient until a first surface of the etch film is exposed in the first region using the mask patterns as an etch mask;

second etching for forming hardmask patterns, under a state that the first surface of the etch film is exposed in the first region and the etch film is not exposed in the second region, by etching the hardmask layer until the second surface of the etch film is exposed in the second region while accumulating polymer by-products on the first surface of the etch film exposed in the first region under a second etching ambient having polymer by-products produced much greater than in the first etching ambient using the mask patterns as an etch mask;

removing the polymer by-products accumulated on the first surface in order to expose the first surface of the etch film; and forming etch film patterns by etching the exposed first surface and the second surface of the etch film using the hardmask patterns as an etch mask.

2. The method of claim 1, wherein, when forming the mask patterns and the buffer layer, the buffer layer covers both sidewalls of the mask patterns with widths of a and b in the second region, and a distance between two adjacent mask patterns from among the mask patterns in the first region is greater than 2(a+b).

3. The method of claim 1, wherein the first etching ambient and the second etching ambient are composed of identical etchant ingredients each including $O_2$, and a flow rate of $O_2$ in the second etching ambient is less than the flow rate of $O_2$ in the first etching ambient.

4. The method of claim 3, after the first etching and before the second etching, further comprising changing the first etching ambient into the second etching ambient when the first surface of the etch film is exposed, wherein, in order to change the first etching ambient to the second etching ambient, the flow rate of $O_2$ is decreased while maintaining other conditions of the first etching ambient originally as in the first etching ambient.

5. The method of claim 1, wherein the first etching ambient and the second etching ambient are composed of identical etchant ingredients, and a temperature of the second etching ambient is lower than a temperature of the first etching ambient.

6. The method of claim 5, after the first etching and before the second etching, further comprising changing the first etching ambient into the second etching ambient when the first surface of the etch film is exposed, wherein, in order to change the first etching ambient into the second etching ambient, the etching temperature in the second etching ambient is lowered to be less than the etching temperature in the first etching ambient while maintaining other conditions of the first etching ambient originally as in the first etching ambient.

7. The method of claim 1, wherein the buffer layer and the hardmask layer are an oxide film;

the mask patterns are a polysilicon film; and the first etching ambient and the second etching ambient are formed of a mixed gas of CxFy (where x and y are integers from 1~10), $O_2$ and Ar.

8. The method of claim 7, wherein, dry etching in terms of a plasma method using a mixed gas of at least one gas selected from the group consisting of $CHF_3$ and $CH_2F_2$, $O_2$ and Ar is used for removing the polymer by-products.

9. The method of claim 1, wherein dry etching in terms of a plasma method is used for removing the polymer by-products.

10. The method of claim 1, wherein an ashing or stripping method is used for removing the polymer by-products.

11. The method of claim 1, wherein the first etching is performed under a state that the hardmask layer is exposed between the mask patterns in the first region and the buffer layer is exposed between the mask patterns in the second region.

12. The method of claim 1, wherein the etch film is composed of a metal, a semiconductor or an insulating material.

13. The method of claim 1, wherein the mask patterns comprise first mask patterns formed in the first region and the second region, and second mask patterns formed only in the second region, and the forming of the mask patterns and the buffer layer comprises;

forming the first mask patterns repeated at a predetermined first pitch to have the first pattern density in the first region, and repeated at a second pitch to have a third pattern density twice the second pattern density in the second region;

forming the buffer layer that covers upper surfaces and sidewalls of the first mask patterns and the upper surface of the hardmask layer; and forming the second mask patterns each located between two adjacent first mask patterns from among the first mask patterns on the buffer layer in the second region.

14. The method of claim 13, wherein the buffer layer has an upper surface where recesses are each formed between the two adjacent first mask patterns from among the first mask patterns; and the second mask patterns are formed within the recesses that are formed in the upper surface of the buffer layer.

15. The method of claim 13, wherein the second mask patterns are formed on a horizontal plane that is the same to that of the first mask patterns.

16. The method of claim 13, after forming the second mask patterns, further comprising partially removing the buffer layer in order to expose the upper surfaces of the first mask patterns.

17. The method of claim 13, after forming the first mask patterns and before forming the buffer layer, further comprising removing the hardmask layer exposed between the first mask patterns from the upper surface of the hardmask layer as much as a first thickness in order to form low surface portions on the upper surface of the hardmask layer.

18. The method of claim 17, wherein the first thickness has a dimension equal to a width of the first mask patterns.

19. The method of claim 13, wherein each of the first mask patterns has a width that is ¼ of the second pitch.

20. The method of claim 13, wherein the first mask patterns and the second mask patterns are a polysilicon film, and the buffer layer and the hardmask layer are an oxide film.

* * * * *